US012685093B2

(12) United States Patent
Schepis

(10) Patent No.: US 12,685,093 B2
(45) Date of Patent: Jul. 14, 2026

(54) METHOD FOR CREATING PRODUCT-LIKE STRESSED SURROGATE TEST WAFERS

(71) Applicant: Tokyo Electron Limited, Tokyo (JP)

(72) Inventor: Anthony R Schepis, Averill Park, NY (US)

(73) Assignee: Tokyo Electron Limited, Tokyo (JP)

( * ) Notice: Subject to any disclaimer, the term of this patent is extended or adjusted under 35 U.S.C. 154(b) by 476 days.

(21) Appl. No.: 18/496,408

(22) Filed: Oct. 27, 2023

(65) Prior Publication Data

US 2025/0140614 A1    May 1, 2025

(51) Int. Cl.
H10P 74/20 (2026.01)
G01R 31/28 (2006.01)

(52) U.S. Cl.
CPC ........ H10P 74/203 (2026.01); G01R 31/2831 (2013.01)

(58) Field of Classification Search
CPC . H10P 74/203; G01R 31/2831; H01L 21/687; H01L 21/67; H01L 21/268; H01L 21/02; H01L 21/322; H01L 21/02532
See application file for complete search history.

(56) References Cited

U.S. PATENT DOCUMENTS

2023/0251574 A1 * 8/2023 Schepis ..................... G03F 7/11

* cited by examiner

*Primary Examiner* — Georgia Y Epps
*Assistant Examiner* — Don J Williams
(74) *Attorney, Agent, or Firm* — Oblon, McClelland, Maier & Neustadt, L.L.P.

(57) ABSTRACT

Aspects of the present disclosure provide a method for creating a product-like surrogate test wafer that mimic a product wafer. For example, the method can include providing a second wafer, forming a stress control layer on the second wafer, and activating the stress control layer according to a first bow measurement of a first wafer to modify an internal stress of the stress control layer such that the second wafer and the stress control layer form a surrogate wafer that has a second bow measurement substantially equal to the first bow measurement.

20 Claims, 7 Drawing Sheets

300

700 start

S310 providing a first wafer and a second wafer

S720 measuring the first and second wafers to identify a relative bow measurement

S330 forming a stress control layer on the second wafer

S740 activating the stress control layer according to the relative bow measurement end

METHOD FOR CREATING PRODUCT-LIKE STRESSED SURROGATE TEST WAFERS

FIELD OF THE INVENTION

The present disclosure relates to semiconductor fabrication, and, more particularly, to methods for creating product-like stressed surrogate test wafers that mimic product wafers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A functional semiconductor wafer is comprised of the integration of 70+ individual layers that ultimately culminate in functional devices. Each level requires multiple process steps including but not limited to thin film deposition, lithography and etch to form the desired structures. Non-uniform wafer stresses induced through these operations result from the patterning of thin films and are amplified via multiple temperature cycling processes, fundamentally distorting the wafer grid. Consequently, each wafer will have a unique stress profile as a function of the individual process tolerances convoluted with the device design.

During the development phase of a new design and/or technology node, it is common for each one of the unit process steps that are part of the 70+ layer integration to undergo optimization to improve feature fidelity and yield. It is therefore imperative to execute this activity on wafers that contain the relevant shape profile and distortions previously alluded to. As one could imagine, having to stage fully integrated wafers at different points in the product flow to exercise development tasks can quickly become cost prohibitive. A fully integrated wafer costs tens of thousands of dollars and hundreds of them are required for development at multiple places in-line.

SUMMARY

Aspects of the present disclosure provide a method for creating a product-like surrogate test wafer that mimics a product wafer. For example, the method can include providing a second wafer, forming a stress control layer on the second wafer, and activating the stress control layer according to a first bow measurement of a first wafer to modify an internal stress of the stress control layer such that the second wafer and the stress control layer form a surrogate wafer that has a second bow measurement substantially equal to the first bow measurement.

In an embodiment, the stress control layer can include a heat sensitive material and is activated by a pattern of heat that corresponds to the first bow measurement of the first wafer. For example, the pattern of heat can be generated via direct laser write. As another example, the pattern of heat can be generated by a plurality of heating units that have an arrangement corresponding to the pattern of heat and generate different temperature ranges. In another embodiment, the stress control layer can include a photosensitive material and is activated by actinic radiation, patterning and etching, the patterning corresponding to the first bow measurement of the first wafer. For example, the actinic radiation can provide localized heating that corresponds to the first bow measurement of the first wafer.

In an embodiment, the method can further include measuring the second wafer to identify a second bow measurement of the second wafer, and calculating a relative bow measurement based on the first bow measurement and the second bow measurement, wherein activating the stress control layer according to the first bow measurement includes activating the stress control layer according to the relative bow measurement.

In an embodiment, the second wafer can include a working surface and a backside surface opposite to the working surface, and the stress control layer can be formed on the backside surface of the second wafer. In another embodiment, the method can further include receiving the first bow measurement. In some embodiments, the method can further include providing the first wafer and measuring the first wafer to identify the first bow measurement of the first wafer. In various embodiments, the method can further include performing process optimization/development on the surrogate wafer.

Aspects of the present disclosure also provide a wafer processing system. For example, the wafer processing system can include a bow measurement device configured to measure a second wafer to identify a second bow measurement of the second wafer, a stress control layer formation device configured to form a stress control layer on the second wafer, an activation device configured to activate the stress control layer, and a controller coupled to the bow measurement device, the stress control layer formation device and the activation device, the controller configured to control the bow measurement device to measure the second wafer to identify the second bow measurement, control the stress control layer formation device to form the stress control layer on the second wafer, calculate a relative bow measurement between a first bow measurement of a first wafer and the second bow measurement of the second wafer, and control the activation device to activate the stress control layer according to the relative bow measurement to modify an internal stress of the stress control layer such that the second wafer and the stress control layer form a surrogate wafer that has a third bow measurement substantially equal to the first bow measurement.

In an embodiment, the stress control layer can include a heat sensitive material, and the activation device can be configured to generate a pattern of heat to activate the heat sensitive material, the pattern of heat corresponding to the relative bow measurement. In another embodiment, the stress control layer can include a photosensitive material, and the activation device can be configured to activate the photosensitive material by actinic radiation, patterning and etching, the patterning corresponding to the relative bow measurement. In some embodiments, the controller is further configured to control the bow measurement device to measure the first wafer to identify the first bow measurement of the first wafer.

Aspects of the present disclosure also provide a method for creating a surrogate wafer. For example, the method can include providing a wafer, forming a stress control layer on the wafer, receiving a target shape signature, and activating the stress control layer according to the target shape signature.

In an embodiment, the target shape signature can be generated from a Bitmap, Joint Photographic Experts Group (JPEG), Graphics Interchange Format (GIF), Portable Network Graphics (PNG) or Tag Image File Format (TIFF) file.

In another embodiment, the target shape signature can be generated by a computer algorithm. In some embodiment, the stress control layer can be activated by a direct write tool that facilitate local and/or blanket activation of the stress control layer. In various embodiments, the method can further include using the wafer with the stress control layer formed thereon for tool handling/operational validation and/or to establish process windows for yield.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1B:
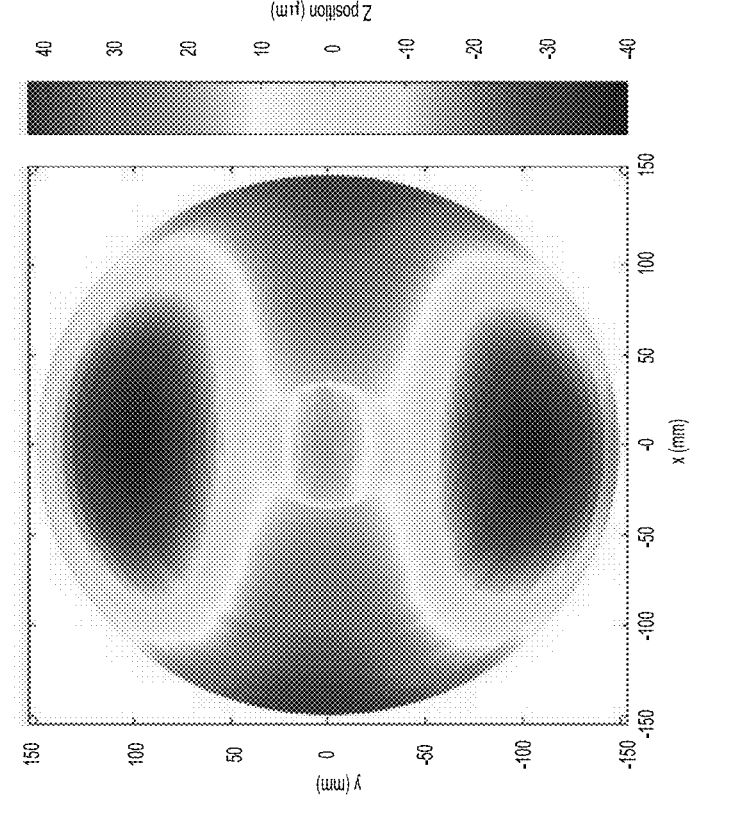
FIGS. 1A and 1B show low order global wafer distortion and high order local wafer distortion, respectively.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Aspects of the present disclosure provide methods for creating product-like surrogate wafers for tool/process development activity that mimic complex wafer shapes/stresses of fully integrated wafers, for the sake of process development/optimization without the cost of employing actual product wafers for testing. For example, a method is proposed to manipulate wafer shape via a stress control layer(s) into a product-like signature to create a surrogate wafer for process optimization/evaluation. The stress control layer(s) may be locally augmented by patterning and/or activation processes to enhance the degrees of freedom. Wafer shape metrology standard to the semiconductor industry can be used as an input function to engineer the correct stress of the stress control layer(s) and optimize augmentation locations such that various product-like wafer distortions may be created.

A typical semiconductor device can be comprised of 70+ individual layers. Each level requires multiple process steps including but not limited to thin film deposition, lithography and etches to form the desired structures. Non-uniform wafer stresses induced through these operations result from the patterning of thin films and are amplified via multiple temperature cycling processes, fundamentally distorting the wafer grid and creating unique wafer shapes throughout the entire integration.

Figure 1A:
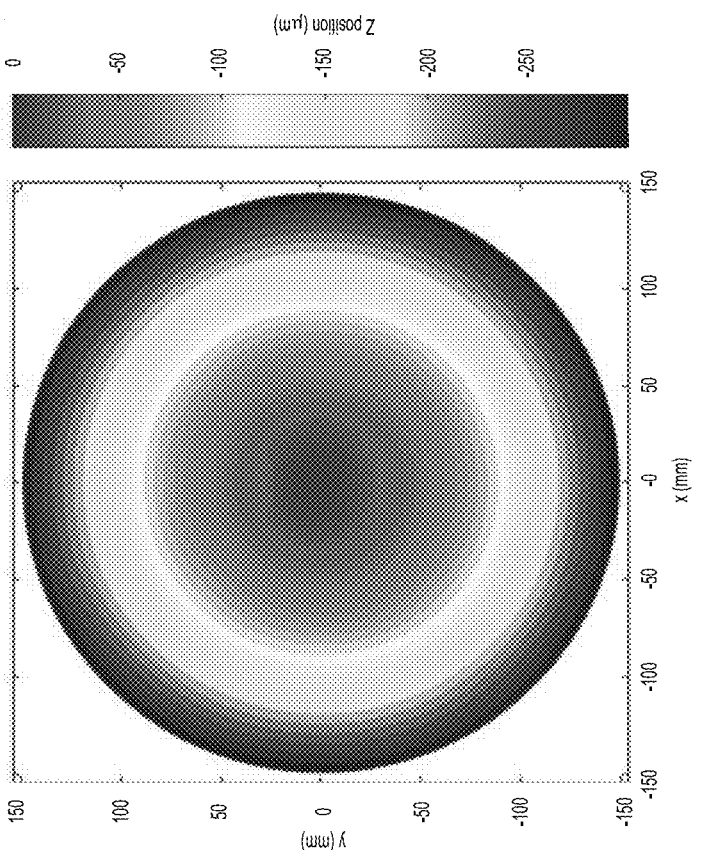

These distortions can manifest as low order global spherical type deformations (or distortions) as depicted in FIG. 1A, which shows z-height variations on 300 nm semiconductor wafers. Higher order localized height variations may exist as stand-alone distortions or may be embedded in the global signature. An example of a higher order localized wafer deformation (or distortion) is presented in FIG. 1B. The magnitude, orientation and localization of these types of distortion will change throughout the production line and even can change on a wafer-by-wafer basis for the same process step as a function of tool variability.

Figure 2:
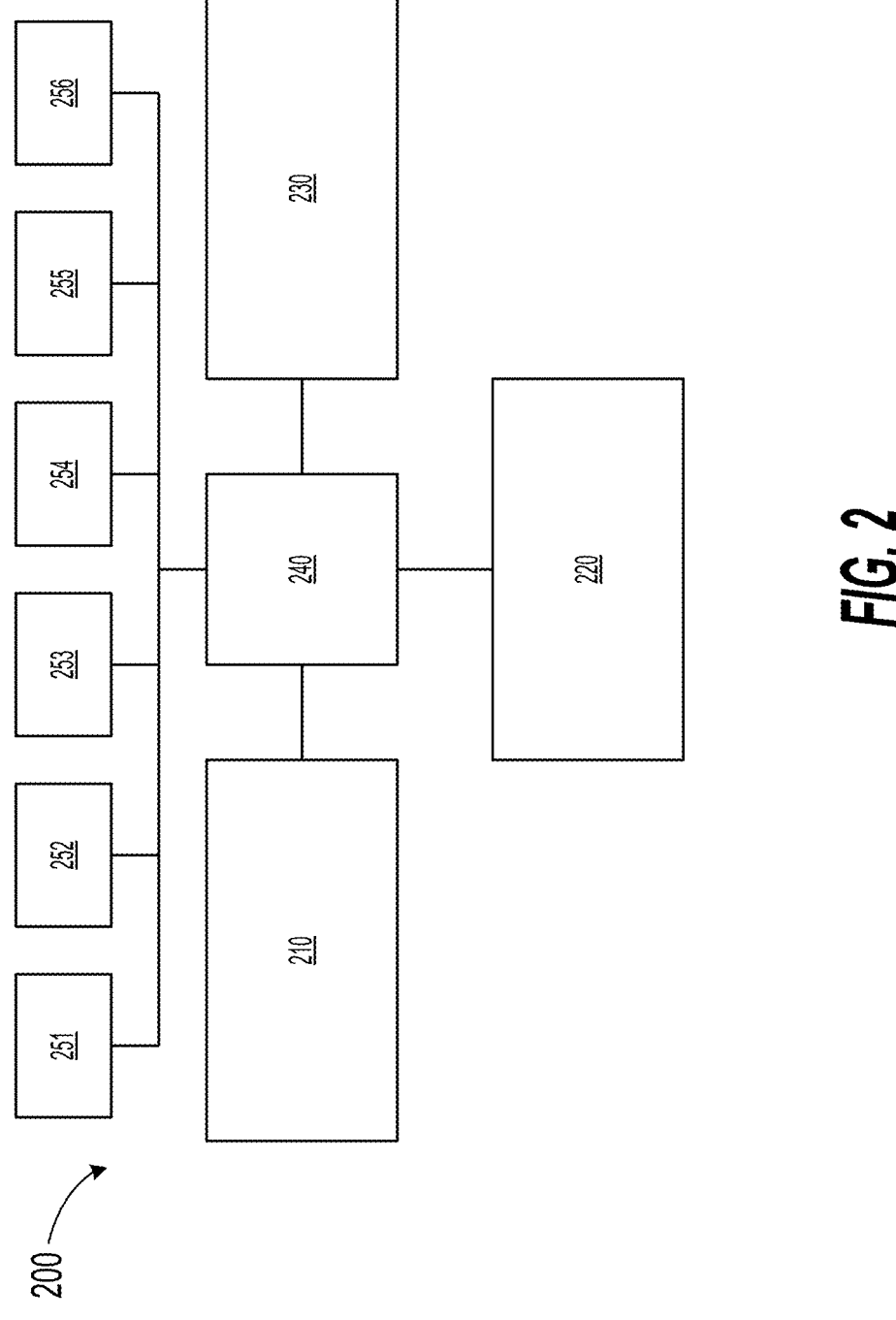
FIG. 2 is a functional block diagram of an exemplary wafer processing system for creating a product-like surrogate wafer according to some embodiments of the present disclosure.

FIG. 2 is a functional block diagram of an exemplary wafer processing system 200 for creating a product-like surrogate wafer according to some embodiments of the present disclosure. The surrogate wafer can mimic an integrated product wafer at various points in its 70+ layer construction to assist in process development for new semiconductor device designs and/or technology nodes. In an embodiment, the surrogate wafer can include a wafer (e.g., an unprocessed wafer) and a stress control layer that is formed on either or both of opposite frontside (or working) and backside surfaces of the unprocessed wafer and have a bow measurement substantially equal to that of the product wafer. The wafer processing system 200 can include metrology equipment, e.g., a bow measurement device 210. In an embodiment, the bow measurement device 210 can be configured to measure a substrate or a wafer (e.g., the unprocessed wafer and the product wafer) to identify a bow measurement of the wafer. In an embodiment, the bow measurement device 210 can use optical (e.g., using a scanning laser technique), acoustic and other mechanisms to measure the z-direction height deviations across a surface of the wafer and store the height deviations by (x, y) coordinates to identify a plurality of sub-bow measurements (x, y) of the bow measurement. The z-direction height deviations can be mapped at various resolutions depending on the type of the metrology equipment used and/or a resolution desired. The bow measurement can include raw bow data or be represented as a bow signature with relative values. In an embodiment, the product wafer can have a working surface and a backside surface opposite to the working surface. The product wafer may have an amount of wafer bow as a result from one or more micro fabrication processing steps that have been executed to create at least part of a semiconductor structure on the working surface of the wafer. For example, transistor gates may be completed or only partially completed.

The wafer processing system 200 can further include a stress control layer formation device 220, e.g., a deposition module, which is configured to form (e.g., deposit) a stress control layer on the backside surface and/or the working surface of the unprocessed wafer. The stress control layer, when reactive to a certain type of activation, may have its internal stress modified by the activation. For example, the stress control layer can include a photosensitive material, which, when exposed to actinic radiation or light, absorbs light in the desired or required energy spectrum and exhibits a chemical/physical reaction that allows applications at different fields. As another example, the stress control layer can include a heat sensitive material, which, when reactive to heat, may have its internal stress modified by the heat to become compressive, neutral or tensile. In an embodiment, the stress control layer can be any combination of (dielectric) films such as oxides, nitrides and/or spin-on (organic) films present on the frontside and/or backside surface of the unprocessed wafer. In another embodiment, the activation processes can be the result of any combination of implant, etch, actinic radiation or light and/or temperature.

The wafer processing system 200 can further include an activation device 230, which is configured to generate a certain type of activation, to which the stress control layer is reactive. In an embodiment, the activation device 230 can include a laser, e.g., a direct laser write, which can provide localized heating to the stress control layer such that the stresses of the stress control layer in different regions can be modified to become compressive, neutral or tensile. In another embodiment, the activation device 230 can include a plurality of heating units, which can be installed on a wafer chuck that is used for a wafer (e.g., the unprocessed wafer) to be placed thereon. The heating units of the activation device 230 can have an arrangement corresponding to a certain pattern of heat and generate different temperature ranges of heat, and the wafer chuck can thus have a plurality of heating zones that correspond to the certain pattern of heat. Accordingly, the stress control layer can be heated in different regions that correspond to the certain pattern of heat and its stresses in the different regions can be modified to become compressive, neutral or tensile. In some embodiments, the activation device 230 can include a light source (or an imaging device) that emits light of a certain wavelength, to which the stress control layer can be exposed and exhibit a chemical/physical reaction that allows applications at different fields.

The wafer processing system 200 can further include a controller 240, which is coupled to the bow measurement device 210, the stress control layer formation device 220 and the activation device 230. In an embodiment, the controller 240 can be configured to control the bow measurement device 210 to measure the wafer (e.g., the product wafer) to identify the bow measurement (and the sub-bow measurements) of the product wafer, control the stress control layer formation device 220 to form the stress control layer(s) on the backside surface and/or the working surface of the unprocessed wafer, and control the activation device 230 to generate and apply the activation onto the stress control layer(s), the activation corresponding to the bow measurement (and the sub-bow measurements) of the product wafer. In another embodiment, the controller 240 can be further configured to control the bow measurement device 210 to measure the unprocessed wafer, if it is not flat enough and has a bow measurement that is not negligible, to identify the bow measurement (and the sub-bow measurements) of the unprocessed wafer, calculate a relative bow measurement by, for example, subtracting the bow measurement of the unprocessed wafer from the bow measurement of the product wafer, control the stress control layer formation device 220 to form the stress control layer(s) on the backside surface and/or the working surface of the unprocessed wafer, and control the activation device 230 to generate and apply the activation onto the stress control layer(s), the activation corresponding to the relative bow measurement. The controller 240 can be a computer processor located within the wafer processing system 200 or located remotely but in communication with components of the wafer processing system 200.

The wafer processing system 200 can further include other components, such as a robot handler 251 configured to flip a wafer, a wafer clamper 252 configured to clamp the wafer, a wafer chuck 253 for the wafer to be placed thereon, a coating device 254 configured to coat a working surface and/or backside surface of the wafer with a photosensitive material (e.g., a photoresist layer) or a heat sensitive material, a development device 255 configured to develop a latent pattern in the photoresist layer, and an etching device 256 configured to use plasma or vapor-phase etching or wet etching to etch the photoresist layer, all of which are coupled to and controlled by the controller 240.

Figure 3:
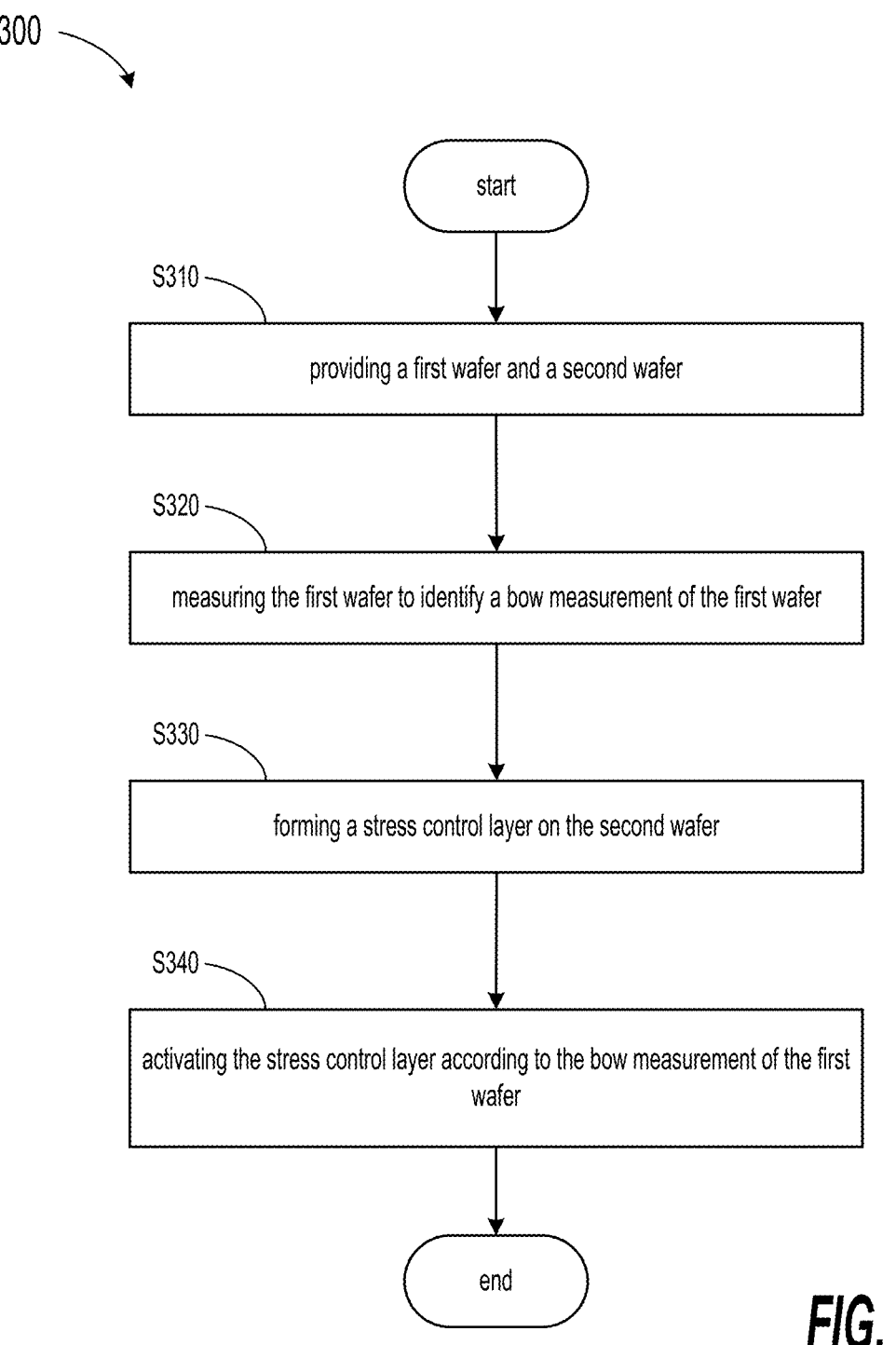
FIG. 3 is a flow chart of an exemplary wafer processing method for creating a product-like surrogate wafer that mimics an integrated product wafer according to some embodiments of the present disclosure.

FIG. 3 is a flow chart of an exemplary wafer processing method 300 for creating a product-like surrogate wafer that mimics an integrated product wafer (or a first wafer) according to some embodiments of the present disclosure. The surrogate wafer can mimic an integrated product wafer at various points in its 70+ layer construction to assist in process development for new semiconductor device designs and/or technology nodes. In an embodiment, the surrogate wafer can include a wafer (or a second wafer, e.g., an unprocessed wafer) and a stress control layer that is formed on either or both of opposite frontside (or working) and backside surfaces of the unprocessed wafer. The stress control layer can be selectively activated to target a specific shape of a product wafer at any stage in its construction, and, therefore, the surrogate wafer can have a bow measurement substantially equal to that of the product wafer. In various embodiments, some of the steps of the wafer processing method 300 shown can be performed concurrently or in a different order than shown, can be substituted by other method steps, or can be omitted. Additional method steps can also be performed as desired. Aspects of the wafer processing method 300 can be implemented by a wafer processing system, e.g., the wafer processing system 200. The wafer processing method 300 starts with step S310, at which a product wafer (or a first wafer) and an unprocessed wafer (or a second wafer) are provided. In an embodiment, a stress control layer can be formed on the unprocessed wafer to generate a product-like surrogate substrate that mimics the product wafer. The wafer processing method 300 can proceed to step S320.

At step S320, the product wafer can be measured to identify a bow measurement of the product wafer. For example, the bow measurement device 210 can be used to measure the product wafer to identify the bow measurement of the product wafer. In an embodiment, steps S320 and S330 can be executed reversely, that is the stress control layer can be formed on the unprocessed wafer first, and then the product wafer is measured to identify a bow measurement of the product wafer. The wafer processing method 300 can proceed to step S330.

At step S330, a stress control layer can be formed on the unprocessed wafer. For example, the stress control layer formation device 220 can be used to form (e.g., deposit) a stress control layer on the backside surface and/or the working surface of the unprocessed wafer. The stress control layer, when reactive to a certain type of activation, may have its internal stress modified by the activation. The wafer processing method 300 can proceed to step S340.

At step S340, the stress control layer can be activated according to the bow measurement of the product wafer. For example, the activation device 230 can be used to activate the stress control layer and modify the internal stress of the stress control layer according to the bow measurement of the product wafer. Therefore, the unprocessed wafer and the stress control layer form the surrogate wafer that mimics the product wafer.

In an embodiment, the stress control layer can include a heat sensitive material, and the activation device 230 can include a laser (e.g., a direct laser write) or a plurality of heating units. For example, the activation device 230 can provide localized heating to the stress control layer according to the bow measurement of the product wafer such that the stresses of the stress control layer combined with the unprocessed wafer in different regions can be modified to become compressive, neutral or tensile, and, as a result, the modified stress control layer and the unprocessed wafer can form the surrogate wafer, which has a substantially equal bow measurement to the product wafer and thus mimics the product wafer.

Figures 4A, 4B, 4C, 4D, 4E, 4F, 4G, 4H, 5:
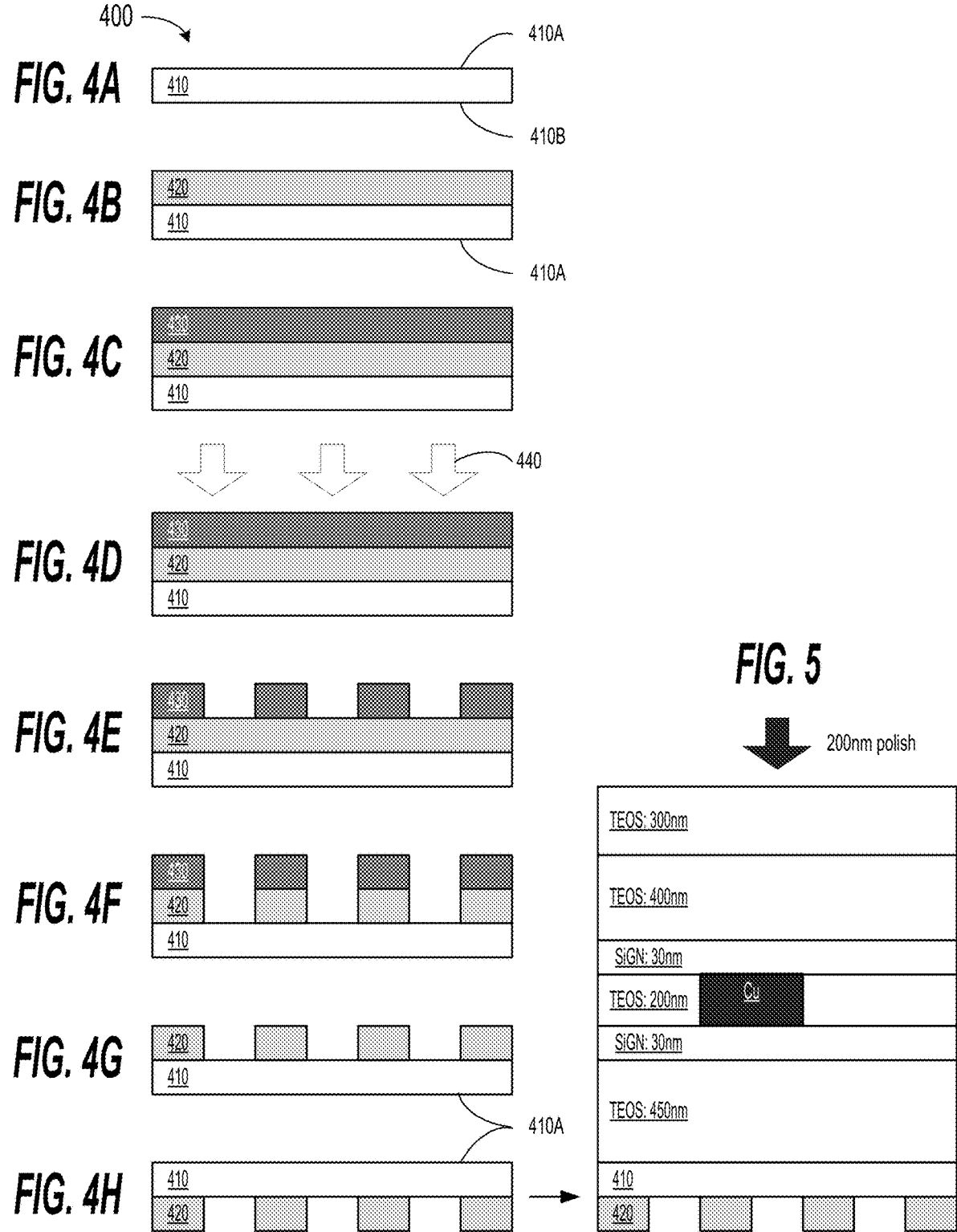
FIGS. 4A to 4H illustrate the formation of a stress control layer of the surrogate wafer according to some embodiments of the present disclosure.
FIG. 5 illustrate subsequent planned process optimization/development performed on the surrogate wafer according to some embodiments of the present disclosure.

In another embodiment, the stress control layer can include a photosensitive material, and the activation device 230 can include a light source (or an imaging device) that emits light of a certain wavelength, to which the stress control layer can be exposed and exhibit a chemical/physical reaction that allows applications at different fields. For example, a substrate 410 (e.g., an unprocessed wafer) can be provided that includes a frontside surface 410A and a backside surface 410B opposite to the frontside surface 410A (as shown in FIG. 4A), the unprocessed wafer 410 can be flipped over and a stress control layer 420 (e.g., a chemical vapor deposition (CVD) SiN film) can be deposited and formed on the backside surface 410B of the unprocessed wafer 410 (as shown in FIG. 4B), a resist (photoresist) layer 430 can be deposited and formed on the stress control layer 420 (as shown in FIG. 4C), a portion of the resist layer 430 can be exposed to actinic radiation 440 (as shown in FIG. 4D) and developed by using a solvent and removed via, for example, a wet or reactive ion etching (RIE) process (as shown in FIG. 4E), the pattern of the remaining resist layer 630 is transferred to the stress control layer 420 by etching the stress control layer 420 (as shown in FIG. 4F), the remaining resist layer 430 is removed (as shown in FIG. 4G), and the unprocessed wafer 410 with the patterned stress control layer 420 formed on the backside surface 410B thereof is flipped over again (as shown in FIG. 4H), and the surrogate wafer (including the unprocessed wafer 410 and the patterned stress control layer 420) can replace the product wafer and subsequent planned process optimization/development can occur on the frontside surface 410A of the unprocessed wafer 410 of the surrogate wafer (as shown in FIG. 5). As another example, in certain cases the activation may not be required at all and desired performance may be achieved by using a native blanket control layer(s), and, accordingly, the flow shown in FIGS. 4A to 4H could end after the stress control layer 420 is deposited and formed on the backside surface of the unprocessed wafer 410 (as shown in FIG. B).

Figure 6:
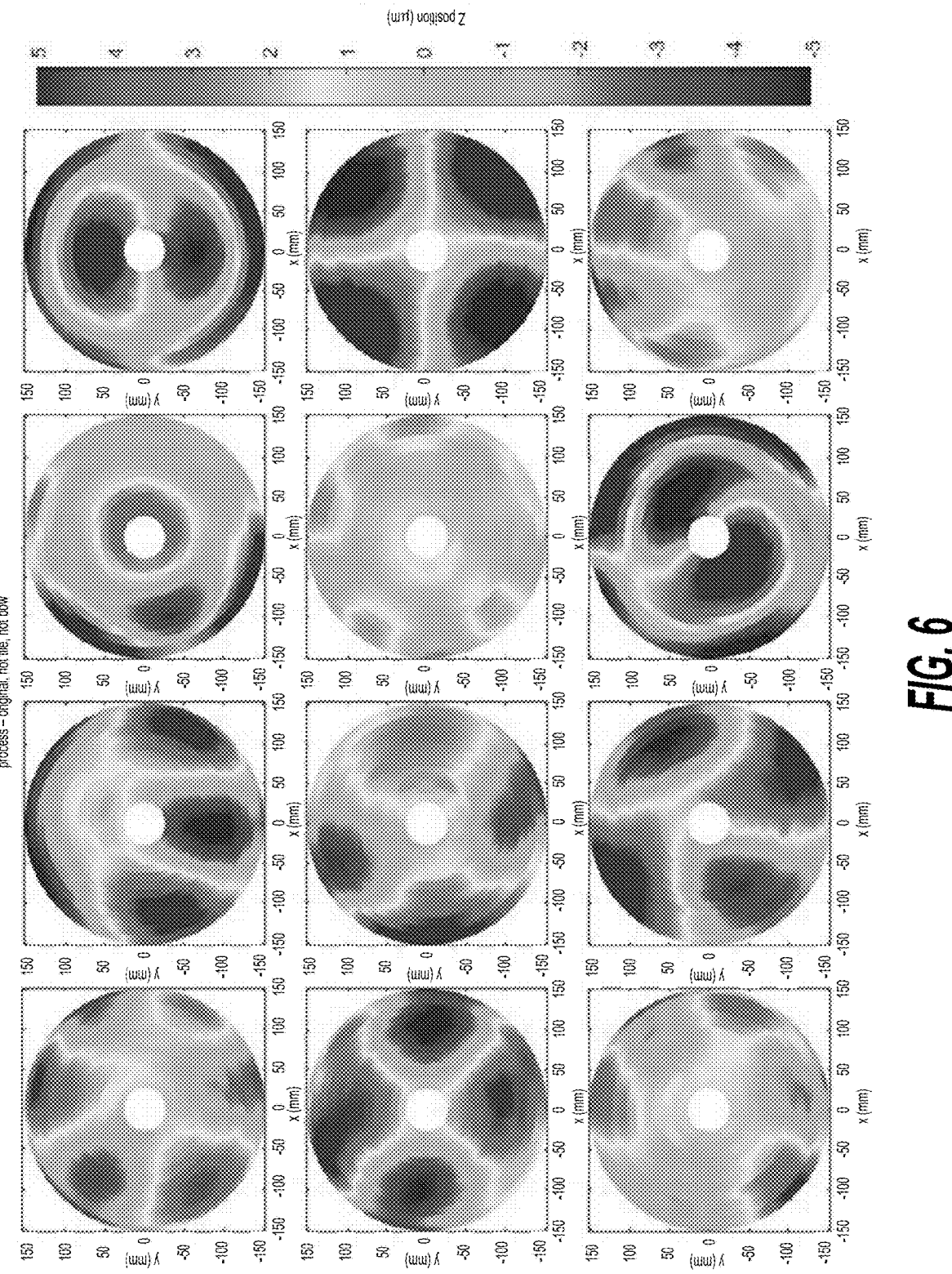
FIG. 6 shows a subset of industry relevant shapes achieved by the wafer processing method according to some embodiments of the present disclosure.

In the flow shown FIGS. 4A to 4H, the bow measurement device 210 can be used to measure the product wafer to obtain its bow measurement (e.g., before the activation). In another embodiment, the bow measurement device 210 can also be used to measure the surrogate wafer to identify its bow measurement (e.g., after the activation). In various embodiment, the bow measurement device 210 can survey the product wafers shape through the line to create target profiles for desirable surrogate wafers shapes. Using the metrology data, computational methods may be employed to generate a pattern to achieve the desired shape manipulation. This pattern will need to be recorded in stress control layer(s) to realize the preferred shape. It has been demonstrating using such process to achieve a multitude of industry relevant shapes, a subset of these potential surrogate manipulations are depicted in FIG. 6. It should be noted that the magnitude of the shape can be modulated through modification of the stress control layer. That is to say, just the range of z-height (z position) exhibited in FIG. 6 is not a limitation of this technology and can be adjusted according to the desired target.

Figure 7:
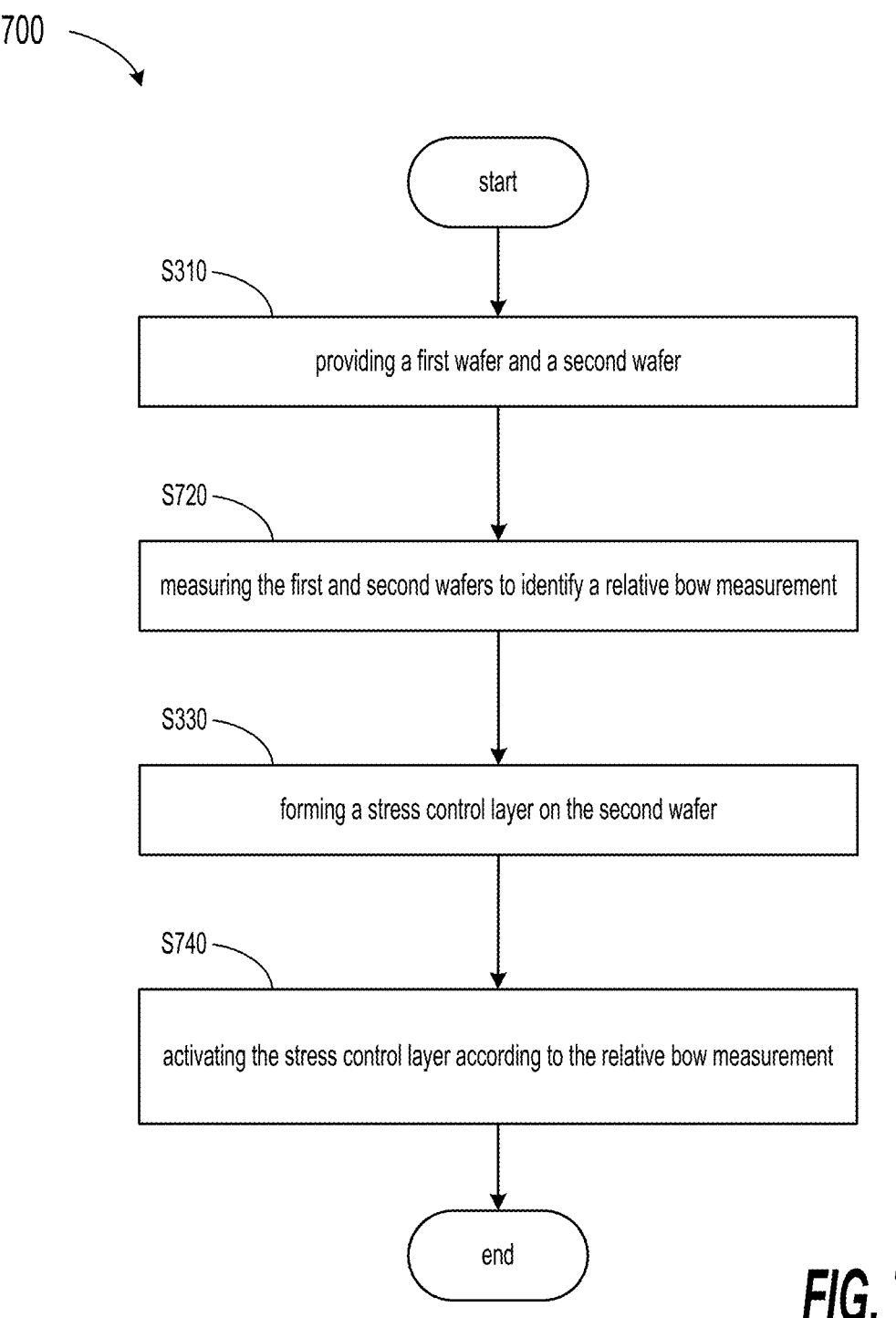
FIG. 7 is a flow chart of an exemplary wafer processing method for creating a product-like surrogate wafer that mimics an integrated product wafer according to some embodiments of the present disclosure.

FIG. 7 is a flow chart of an exemplary wafer processing method 700 for creating a product-like surrogate wafer that mimics an integrated product wafer (or a first wafer) according to some embodiments of the present disclosure. The wafer processing method 700 includes steps of S310 and S330 and steps S720 and S740. The wafer processing method 700 starts with step S310, at which a first wafer (e.g., a product wafer) and a second wafer (e.g., an unprocessed wafer) are provided, and the unprocessed wafer is not flat enough and has a bow measurement that is not negligible. The wafer processing method 700 can proceed to step S720.

At step S720, the product wafer and the unprocessed wafer are measured to identify their respective bow measurements and a relative bow measurement between the product wafer and the unprocessed is calculated. For example, the bow measurement device 210 can be used to measure the product wafer to identify the bow measurement of the product wafer and measure the unprocessed wafer to identify the bow measurement of the unprocessed wafer, and the controller 240 can calculate the relative bow measurement by subtracting the bow measurement of the unprocessed wafer from the bow measurement of the product wafer. In an embodiment, the product wafer may not require bow measurement. For example, the bow measurement of the product wafer could be historical and fed back. In another embodiment, the unprocessed wafer may not always require bow measurement either. For example, it can be assumed that there is some sort of specification for native distortion on the unprocessed wafer that is much smaller than the surrogate target wafer, and, therefore, the unprocessed wafer does not require bow measurement. The wafer processing method 700 can proceed to step S330, at which a stress control layer is formed on the frontside surface and/or the backside surface of the unprocessed wafer. In an embodiment, steps S720 and S330 can be executed reversely, that is the stress control layer can be formed on the unprocessed wafer first, and then the relative bow measurement between the product wafer and the unprocessed can be calculated. The wafer processing method 700 can proceed to step S740.

At step S740, the stress control layer can be activated according to the relative bow measurement. For example, the activation device 230 can be used to activate the stress control layer and modify the internal stress of the stress control layer according to the relative bow measurement. Therefore, the unprocessed wafer and the stress control layer form the surrogate wafer that mimics the product wafer.

Figure 8C:
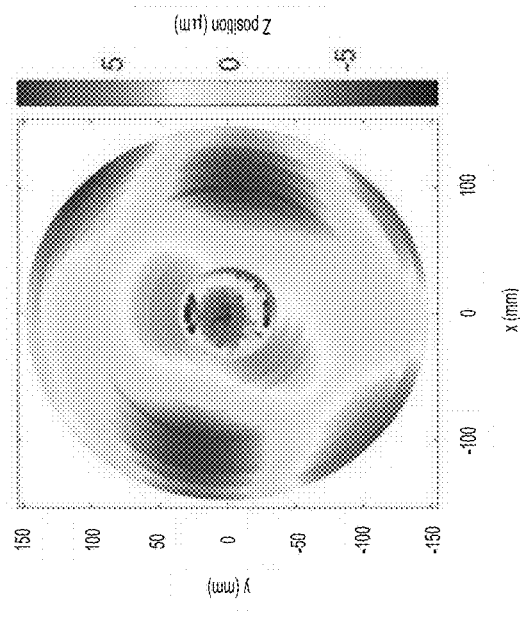
FIGS. 8A to 8C illustrate the transferring of an image into a stress control layer to realize a unique stress profile according to some embodiments of the present disclosure.
Figure 8B:
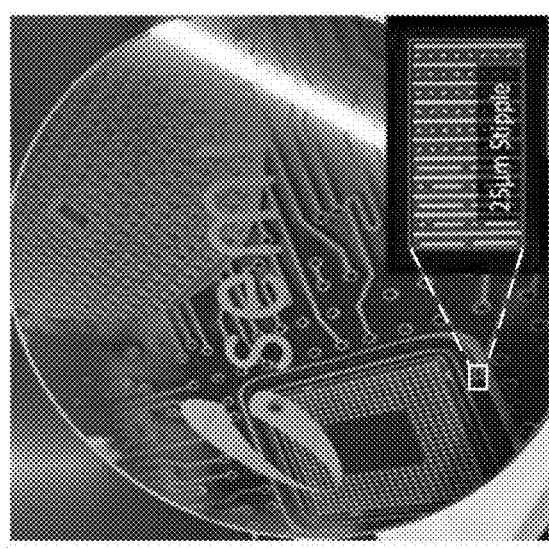
Figure 8A:
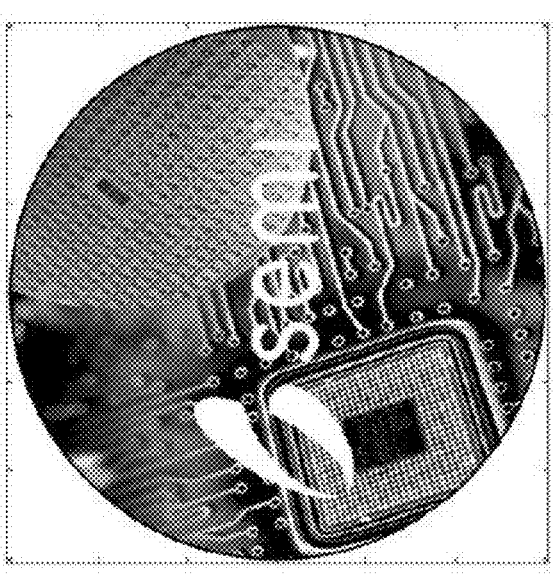

In certain cases, it may be desirable to validate the robustness of a semiconductor unit process using randomly generated unique surrogate stress signatures. When coupled with a direct (laser) write system, the wafer processing methods 300 and 700 for generating surrogate wafers can be coupled with photographic images in Bitmap, Joint Photographic Experts Group (JPEG), Graphics Interchange Format (GIF), Portable Network Graphics (PNG) or Tag Image File Format (TIFF) format to selectively activate the stress control layer. This image could then be computationally broken down into segments of stippled micron-scale features to be realized in the stress control layer. An example is depicted in FIGS. 8A to 8C where a PNG image (FIG. 8A) was transferred into a stress control layer in different densities of micron scale features (FIG. 8B) to realize a unique stress profile (FIG. 8C). With digital image sensors in abundance, one could take a picture of literally any object and transform it into a unique stress profile.

Similarly, a computation program could place random micron-sized polygons in a CAD layout on its own if constructed to do so without an image input. For example, a wafer processing method can be provided that includes providing a wafer (e.g., a surrogate wafer), forming a stress control layer on the wafer, receiving a target shape signature, and activating the stress control layer according to the target shape signature. In an embodiment, the target shape signature can be generated by a computer algorithm. In another embodiment, the stress control layer can be activated by a direct write tool that facilitate local and/or blanket activation of the stress control layer. In some embodiments, the method can further include using the wafer with the stress control layer formed thereon for tool handling/operational validation and/or to establish process windows for yield.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
providing a second wafer;
forming a stress control layer on the second wafer; and
activating the stress control layer according to a first bow measurement of a first wafer to modify an internal stress of the stress control layer such that the second wafer and the stress control layer form a surrogate wafer that has a second bow measurement substantially equal to the first bow measurement.

2. The method of claim 1, wherein the stress control layer includes a heat sensitive material and is activated by a pattern of heat that corresponds to the first bow measurement of the first wafer.

3. The method of claim 2, wherein the pattern of heat is generated via direct laser write.

4. The method of claim 2, wherein the pattern of heat is generated by a plurality of heating units that have an arrangement corresponding to the pattern of heat and generate different temperature ranges.

5. The method of claim 1, wherein the stress control layer includes a photosensitive material and is activated by actinic radiation, patterning and etching, the patterning corresponding to the first bow measurement of the first wafer.

6. The method of claim 5, wherein the actinic radiation provides localized heating that corresponds to the first bow measurement of the first wafer.

7. The method of claim 1, further comprising:

measuring the second wafer to identify a second bow measurement of the second wafer; and calculating a relative bow measurement based on the first bow measurement and the second bow measurement, wherein activating the stress control layer according to the first bow measurement includes activating the stress control layer according to the relative bow measurement.

8. The method of claim 1, wherein the second wafer includes a working surface and a backside surface opposite to the working surface, and the stress control layer is formed on the backside surface of the second wafer.

9. The method of claim 1, further comprising:

Receiving the first bow measurement.

10. The method claim 1, further comprising:

providing the first wafer; and measuring the first wafer to identify the first bow measurement of the first wafer.

11. The method of claim 1, further comprising:

performing process optimization/development on the surrogate wafer.

12. A wafer processing system, comprising:

a bow measurement device configured to measure a second wafer to identify a second bow measurement of the second wafer;

a stress control layer formation device configured to form a stress control layer on the second wafer;

an activation device configured to activate the stress control layer; and a controller coupled to the bow measurement device, the stress control layer formation device and the activation device, the controller configured to control the bow measurement device to measure the second wafer to identify the second bow measurement, control the stress control layer formation device to form the stress control layer on the second wafer, calculate a relative bow measurement of a first bow measurement of a first wafer and the second bow measurement of the second wafer, and control the activation device to activate the stress control layer according to the relative bow measurement to modify an internal stress of the stress control layer such that the second wafer and the stress control layer form a surrogate wafer that has a third bow measurement substantially equal to the first bow measurement.

13. The wafer processing system of claim 12, wherein the stress control layer includes a heat sensitive material, and the activation device is configured to generate a pattern of heat to activate the heat sensitive material, the pattern of heat corresponding to the relative bow measurement.

14. The wafer processing system of claim 12, wherein the stress control layer includes a photosensitive material, and the activation device is configured to activate the photosensitive material by actinic radiation, patterning and etching, the patterning corresponding to the relative bow measurement.

15. The wafer processing system of claim 14, wherein the controller is further configured to control the bow measurement device to measure the first wafer to identify the first bow measurement of the first wafer.

16. A method, comprising:

providing a wafer;

forming a stress control layer on the wafer;

receiving a target shape signature; and activating the stress control layer according to the target shape signature.

17. The method of claim 16, wherein the target shape signature is generated from a Bitmap, Joint Photographic Experts Group (JPEG), Graphics Interchange Format (GIF), Portable Network Graphics (PNG) or Tag Image File Format (TIFF) file.

18. The method of claim 16, wherein the target shape signature is generated by a computer algorithm.

19. The method of claim 16, wherein the stress control layer is activated by a direct write tool that facilitate local and/or blanket activation of the stress control layer.

20. The method of claim 16, further comprising:

using the wafer with the stress control layer formed thereon for tool handling/operational validation and/or to establish process windows for yield.

* * * * *